United States Patent
Hackl et al.

(10) Patent No.: US 10,067,517 B2
(45) Date of Patent: Sep. 4, 2018

(54) METHOD AND DEVICES FOR EXTENDED INSULATION-FAULT SEARCH USING A MULTIFUNCTIONAL TEST CURRENT

(71) Applicant: Bender GmbH & Co. KG, Gruenberg (DE)

(72) Inventors: Dieter Hackl, Fernwald (DE); Oliver Schaefer, Gruenberg (DE)

(73) Assignee: BENDER GMBH & CO. KG, Grunberg (DE)

( * ) Notice: Subject to any disclaimer, the term of this patent is extended or adjusted under 35 U.S.C. 154(b) by 240 days.

(21) Appl. No.: 15/219,060

(22) Filed: Jul. 25, 2016

(65) Prior Publication Data

US 2017/0031373 A1 Feb. 2, 2017

(30) Foreign Application Priority Data

Jul. 31, 2015 (DE) .................. 10 2015 214 615

(51) Int. Cl.
  *H02B 1/24* (2006.01)
  *G05F 1/10* (2006.01)
  *G01R 31/08* (2006.01)
  *H02H 3/16* (2006.01)

(52) U.S. Cl.
  CPC ............ *G05F 1/10* (2013.01); *G01R 31/083* (2013.01); *H02H 3/16* (2013.01)

(58) Field of Classification Search
  CPC .. H02H 9/001; H03K 17/0822; H03K 17/166; F02P 3/051; G06F 1/266; G01R 31/025; G01R 31/08; G01R 31/088; G01R 31/085; G01R 31/024
  USPC ................. 307/131; 324/522, 551
  See application file for complete search history.

(56) References Cited

U.S. PATENT DOCUMENTS

| | | | |
|---|---|---|---|
| 2007/0081281 A1* | 4/2007 | Hamer | H02H 3/165 361/42 |
| 2015/0077130 A1* | 3/2015 | Hackl | G01R 19/0092 324/522 |
| 2015/0168481 A1* | 6/2015 | Hackl | G01R 27/18 324/551 |

FOREIGN PATENT DOCUMENTS

| | | |
|---|---|---|
| DE | 102013218836 A1 | 3/2015 |
| EP | 1855366 A2 | 11/2007 |

* cited by examiner

*Primary Examiner* — Quan Tra
(74) *Attorney, Agent, or Firm* — King & Schickli, PLLC

(57) ABSTRACT

The invention relates to a method and to devices for extended insulation-fault search in an IT power supply system using a multifunctional test current, wherein, selectively and depending on the application, the test current functions as a voltage compensation current so as to compensate a voltage increase in an active conductor of the IT power supply system, as a tripping current so as to trip a residual current protection device arranged in a subsystem of the IT power supply system and/or as a leakage-capacitance compensation current so as to compensate a capacitive leakage current. The test current can fulfil more than one of the cited functions simultaneously.

14 Claims, 2 Drawing Sheets

(State of the art)

Figure 1:
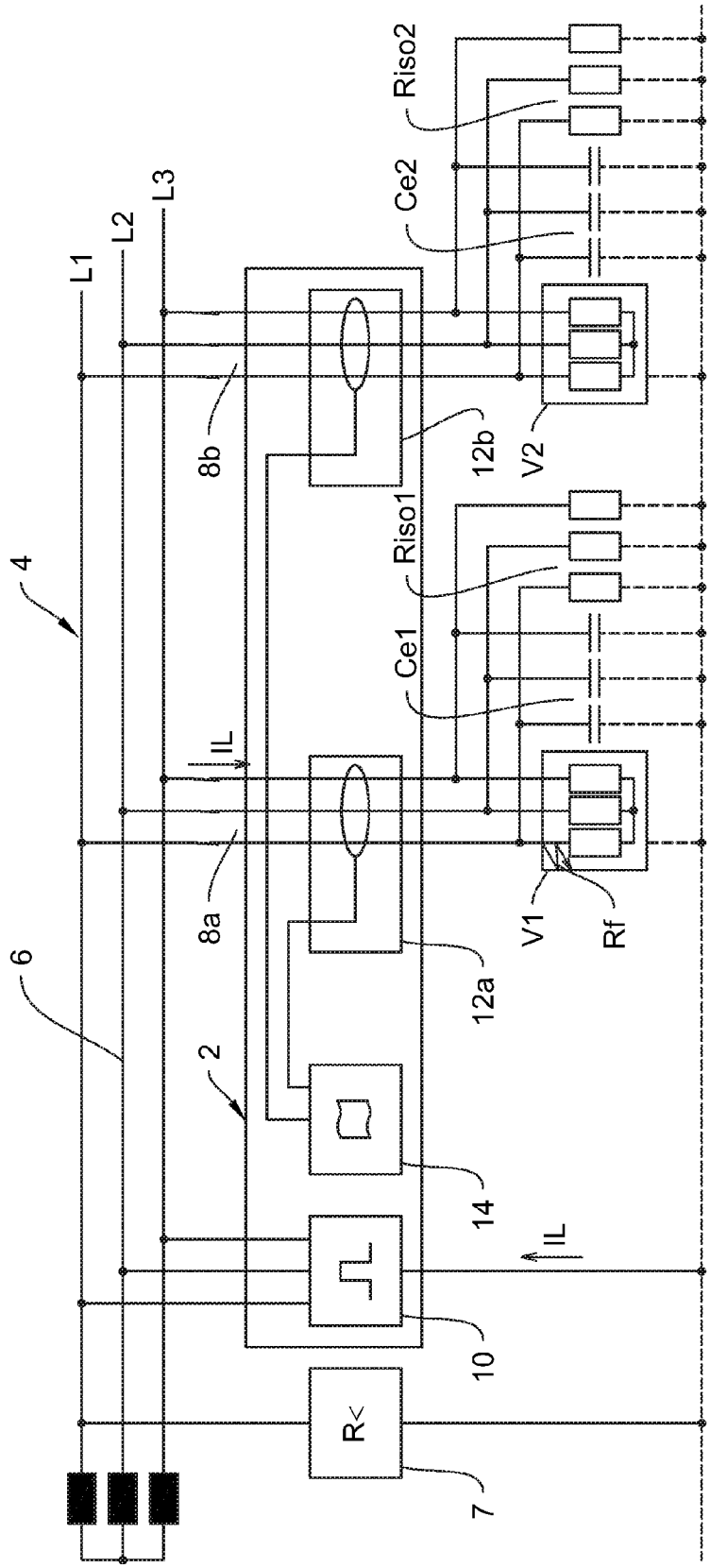

METHOD AND DEVICES FOR EXTENDED INSULATION-FAULT SEARCH USING A MULTIFUNCTIONAL TEST CURRENT

This application claims the benefit of German Patent Application no. 10 2015 214 615.4, filed Jul. 31, 2015, the disclosure of which is incorporated by this reference.

TECHNICAL FIELD

The invention relates to a method for extended insulation-fault search in an IT power supply system, comprising the following method steps: feeding a test current functioning as a locating current into at least one active conductor of the IT power supply system, registering a test-current portion in a subsystem of the IT power supply system, and evaluating the registered test-current portion to locate an insulation fault.

Furthermore, the invention relates to a test-current generator for extended insulation-fault search in an IT power supply system and to an insulation-fault search system for extended insulation-fault search in an IT power supply system, comprising a test-current generator for generating and feeding a test current, a test-current registering device and an insulation-fault evaluating device.

BACKGROUND

In a situation where higher requirements in terms of operational, fire, and contact safety have to be met when supplying electrical equipment with energy, the network type of an ungrounded power supply system is used, which is also known as an insulated network (French: isolé terre—IT) or IT system. In this kind of power supply system, the active parts are separated from the ground potential, i.e. against ground. The advantage of these networks is that the function of the electrical equipment is not affected in case of a first insulation fault, such as a fault to ground or a fault to frame, because the ideally infinitely large impedance value prevents a closed circuit from forming between the active conductors of the network and ground in this first fault case (first fault).

In a three-phase IT system, the outer conductors L1, L2, L3 and, if present, the neutral conductor N are referred to as the active conductors. In a single-phase IT system without a center tap, the two outer conductors L1 and L2 are the active conductors; in case of a center tap, the mid-point conductor is an active conductor, too.

The inherent safety of the IT power supply system thus ensures a continuous power supply of the loads fed by the IT power supply system, namely of the equipment connected to the IT power supply system, even if a first insulation fault occurs.

Hence, the resistance of the IT power supply system against ground (insulation resistance; also called insulation fault resistance or fault resistance in the fault case) is continuously monitored because another potential fault on another active conductor (second fault) would cause a fault loop and the resulting fault current, in connection with an overcurrent protection device, would lead to a shutdown of the installation and to a standstill of operation.

Based on the condition that the state of insulation of the IT power supply system is continuously monitored by an insulation monitoring device, the IT power supply system can continue to operate without a prescribed time limit even when a first fault has occurred. Still, it is recommended according to standards DIN VDE 0100-410 and IEC 60364-4-41 that the first fault be eliminated as quickly as practically possible.

To meet the requirement of quick elimination of the first fault, the use of an insulation-fault search system is the state of the art especially in extensive, complex IT power supply systems or in IT power supply systems in which a shutdown of the power supply for the entire IT power supply system may be safety-critical.

If a first insulation fault has been recognized in the IT power supply system by the insulation monitoring device, the insulation-fault search begins in that a test-current generator, which may be a separate device or part of the insulation monitoring device, generates a test current and feeds it into the IT power supply system at a central point. This test-current signal is registered (test-current registering device) by all measuring-current transformers located within the faulty line outlet of a subsystem and is evaluated and displayed by an insulation-fault evaluating device. By associating the measuring-current transformer with the line outlet (subsystem), the fault location can be located.

Despite these advantages, the IT power supply system is still used relatively rarely compared to grounded power supply systems. One reason for this are the three problematic areas mentioned below.

A first problem (excess voltage) relates to the danger that when a first insulation fault occurs in an IT power supply system in one of the outer conductors, a potential difference against the ground potential occurs on the other active conductors for which the connected equipment (loads) is not designed. This excess voltage is problematic if the suppression measures (e.g. Y capacitors) on the connected equipment are not designed for this increased potential difference. Moreover, the insulating materials of the lines are under increased strain as well and may sustain permanent damage.

This problem occurs in particular if connected equipment originally designed for the use in grounded power supply systems is used in IT power supply systems in unchanged form and without review of the equipment properties.

Oftentimes, the only solution common thus far to this problem is the time-consuming and costly replacement of the unsuitable equipment with equipment having suitable properties. Alternatively, a complex redundant reconfiguration of the grounded power supply system is necessary in order to achieve the high availability and thus reliability of supply of an IT power supply system.

A second problematic area (displacement direct voltage) relates to applications in which IT alternating-current (AC) supply systems having coupled direct-current (DC) branches, such as a DC intermediate circuit in controlled drives, are combined with equipment that, in case of an occurring displacement direct voltage, which is generated by a poor insulation resistance of the DC circuit and exceeds a limit tolerated by the equipment, can be brought into a critical operating state, which may lead to failure of the equipment.

Monitoring of the DC displacement voltage by means of a voltage relay in connection with a shutdown of the controlled drive causing the DC displacement voltage because of an insulation fault in the DC intermediate circuit, for example, is known from the state of the art. In case of multiple potential sources of DC displacement voltages, however, determining the system branch to be shut down is difficult or even impossible.

Alternatively, the use of a B-type residual current protection device (RCD) is known for shutting down the system branch in which the DC residual current is flowing. However, this measure is accompanied by the disadvantage that in case of high-powered drives with high load currents, even a small asymmetry or weak saturation effects of the residual-current sensor technology may cause false tripping.

As a third problematic area (subsystem shutdown), it is often necessary in large, often highly branched IT power supply systems to quickly shut down the subsystem only in which a potentially hazardous fault (second fault) has occurred without also shutting down other subsystems or even the entire IT power supply system.

In extensive IT power supply systems according to the state of the art, this problem has been addressed by using directional residual current monitors (RCMs).

For the directional detection to function reliably, the condition that the total value of the network leakage capacitances on the network side ("upstream" of the respective residual current measuring device) is many times larger than the total value of the network leakage capacitances on the load side ("downstream" of the respective residual current measuring device) has to be fulfilled. Product standards prescribe a ratio of at least 6:1.

Meeting this requirement means high technical expenditures for both the installer and the operator of the electrical installation. Practice has shown that fulfillment of this condition necessary for the reliable operation of an electrical protection device cannot be safely ensured under all operating conditions and throughout the entire lifespan of the electrical installation.

Thus, it has to be stated that there are solution approaches to the three mentioned problematic areas, but they only address one problem at each and do not take a higher perspective as a basis to find a joint solution for all three problems. Moreover, the task of insulation-fault search is neglected.

SUMMARY

Therefore, the object of the present invention is to enhance a method and a device in such a manner that in addition to the insulation-fault search being performed, the problem of a voltage increase (first and second problem) due to an excess voltage (first problem) in case of a fault or due to a displacement voltage (second problem) is addressed and a selective shutdown (third problem) of the faulty subsystem (s) only is possible in case of a second fault. Moreover, the dangers caused by capacitive leakage currents are to be reduced when an active conductor is touched.

With respect to a method, this object is attained in connection with the preamble of claim 1 in that, selectively and depending on the application, the test-current functions as a voltage compensation current so as to compensate a voltage increase in an active conductor of the IT power supply system, as a tripping current so as to trip a residual current protection device arranged in a subsystem of the IT power supply system, and/or as a leakage-capacitance compensation current so as to compensate a capacitive leakage current. The test current can fulfil more than one of the cited functions simultaneously.

Assuming that the IT power supply system is properly monitored by means of an insulation monitoring device, the idea of the present invention is based on generating and feeding into the IT power supply system a test current that can fulfil different functions depending on the task to be solved. The respective task originates from one of the three problem areas described above. Corresponding to the task, several functions can be performed at the same time.

Functioning as a voltage compensation current, the test current compensates a voltage increase in an active conductor of the IT power supply system (solution to the first and second problems). According to the invention, the compensating effect of the test current functioning in this way can counteract the problem of a voltage increase putting equipment and personnel at risk.

According to the invention, the test current functioning as a tripping current is capable of tripping a residual current protection device arranged in a subsystem of the IT power supply system and of thus advantageously causing a selective shutdown of the endangered subsystem only (solution to the third problem).

In an advantageous manner, in another, additional function as a leakage-capacitance compensation current, the test current is suitable for compensating a capacitive leakage current. A danger to personnel due to capacitive leakage currents is thus avoided when an active conductor is touched.

The feeding of the multifunctional test current according to the invention allows precluding the risks to personnel and equipment originating from a voltage increase, achieving selective shutdown of a subsystem and, additionally, eliminating the danger from a capacitive leakage current in a comprehensive solution concept for an IT power supply system.

In another advantageous embodiment, the test current functioning as a voltage compensation current achieves a compensation of an excess voltage caused by a low-resistance insulation fault.

If a voltage increase against ground occurs in an active conductor of the IT power supply system in the form of an excess voltage caused by a low-resistance insulation fault, this increased potential difference can be counteracted by feeding a test current for compensating the increased potential difference into the active conductor exhibiting the excess voltage.

Furthermore, the test current acting as a voltage compensation current achieves a compensation of a displacement direct voltage.

Functioning as a voltage compensation current, the test current can also be set in such a manner that a displacement direct voltage exceeding a limit tolerated by the equipment is compensated. Since it is often difficult to exactly locate the fault causing the displacement direct voltage, all pieces of equipment that may be exhibiting the fault, such as all drive components, are usually shut down in this case. However, the shutdown may lead to safety-critical situations, such as to disabled crane installations. This situation can be avoided if, according to the invention, the test current functioning as a voltage compensation current compensates this displacement direct voltage and thus precludes any risks from the equipment or to the equipment itself.

Preferably, when the test current functions as a voltage compensation current and as a leakage-capacitance compensation current, at least one of the test-current parameters test-current amplitude, test-current frequency and test-current phase is determined by control.

By a control of this kind, the test current is specifically changed in a closed loop in such a manner that the voltage increase is virtually zero.

In pure IT direct-current systems, this can be achieved by feeding the test current as a compensation direct current into an outer conductor against ground and correspondingly controlling the amplitude of the test current.

In 3-phase IT alternating-current systems, the test current is fed as a mains-frequency alternating compensation current into at least one outer conductor against ground and its amplitude and phase are correspondingly controlled so as to compensate the excess (alternating) voltage.

In 3-phase IT alternating-current systems having coupled direct current (DC) branches, such as in case of the installation of controlled drives or when operating non-linear loads, the compensation of a DC displacement voltage is achieved by feeding a complex test-current pattern into multiple outer conductors.

By means of the control, it is also possible to control an alternating compensation current in such a manner that capacitive leakage currents are compensated far enough that touching an outer conductor of the IT power supply system does not pose a risk to personnel.

To avoid high compensation currents in case of large network leakage capacitances, a slow increase of the test-current amplitude is to be provided until a voltage increase is compensated or a predefined test-current value is reached.

Preferably, a maximum test-current value is predefined by a factory setting or directly by the user, or the maximum test-current value is derived from at least one electrical system parameter of the IT power supply system, the electrical system parameter being configured statically or determined dynamically.

The maximum test-current value can be set as factory default or defined manually by the user based on the electrical system parameters of the IT power supply system directly upon configuration of the method. As another option, it is envisaged that the maximum test-current value can be automatically derived from the electrical parameters of the IT power supply system. Again, the electrical system parameters can be available as statically configured parameters or be determined dynamically. Dynamic determination may take place by directly measuring the relevant system parameter, for example, or the system parameter is retrieved via communication as a previously determined value from an installed (monitoring) device, such as an insulation monitoring device.

As a relevant electrical system parameter for determining the maximum test-current value, at least one of the following variables is to be taken into account:
insulation resistance value,
distribution of the insulation resistance values across the individual outer conductors (phases),
size of the network leakage capacitances,
present voltage increase,
maximum admissible voltage increase, separately for AC and DC portions, if applicable,
limit for admissible active power that may be converted in a fault resistance.

In addition, system-relevant standards and indications for system configuration (such as regarding the safety-critical categorization) can be considered.

Furthermore, feeding of the test current as a voltage compensation current begins when a critical voltage-increase limit value is exceeded.

As explained in the introductory portion of the description of the invention, the feeding of the test current according to the state of the art is started solely for insulation-fault search. The feeding is usually started manually by the operator of the IT power supply system or automatically by the insulation monitoring device when an insulation fault falls below an insulation-fault limit value.

To solve the problems "excess voltage" and "displacement direct voltage", the test current acts as a voltage compensation current. In these applications, test-current feeding starts as soon as a critical voltage-increase limit value is exceeded.

To solve the problem "subsystem shutdown", the test current functions as a tripping current for a residual current protection device. Feeding of the test current in this application starts when the insulation resistance falls below an insulation-resistance limit value or upon exceedance of a critical voltage-increase limit value.

Furthermore, a duration of the test-current feeding and/or a duration of the test current feeding at maximum test-current value is limited.

Aside from the limitation to a maximum test-current value, the duration of the test-current feeding and/or the duration of the test-current feeding at maximum test-current value can be limited so as to avoid running the IT power supply system into a dangerous state due to the test-current load or to avoid an unintentional shutdown of important subsystems.

Furthermore, the object is attained by a test-current generator for extended insulation-fault search, the generator being configured as a multifunction test-current generator comprising circuitry-related and programming-related devices that generate not only a test current for locating the insulation fault, but also, selectively and depending on the application, a voltage compensation current for compensating a voltage increase in an active conductor of the IT power supply system, a tripping current for tripping a residual current protection device arranged in a subsystem of the IT power supply system, and a leakage-capacitance compensation current for compensating a capacitive leakage current.

Implementing the method according to the invention, the multifunctional test-current generator according to the invention comprises circuitry-related and programming-related devices that, in addition to the use of the test-current generator for insulation-fault search, also allow a use for compensating a voltage increase, for targeted shutdown of a subsystem, and for compensation of a capacitive leakage current.

To this end, the test-current generator according to the invention is capable of generating current courses suiting the respective application and fulfilling the function of a voltage compensation current, of a tripping current and/or of a leakage-capacitance compensation current. The test current is also capable of fulfilling more than one function at a time.

In an advantageous embodiment, the circuitry-related and programming-related devices comprise a control device for setting a test-current parameter.

Setting one or more of the test-current parameters amplitude, frequency and phase takes place by way of a control in such a manner that the desired state of compensation sets in.

Advantageously, the circuitry-related and programming-related devices comprise a checking device for controlling the sequence of test-current generation and feeding.

By means of a checking device for controlling the sequence of test-current generation and feeding, the entire sequence, in particular start and finish of generation and feeding, can be set and controlled.

Furthermore, the object is attained by an insulation-fault search system for extended insulation-fault search in an IT power supply system, comprising a test-current generator for generating and feeding a test current, a test-current registering device and an insulation-fault evaluating device, wherein the test-current generator is realized as a multifunction test-current generator according to the invention.

The test-current generator according to the invention can be constructed as a separate device or be integrated into an insulation-fault search system. Aside from insulation-fault search, the insulation-fault search system equipped with the test-current generator according to the invention thus makes it possible to increase the electrical safety in IT power supply systems by an extended range of functions.

BRIEF DESCRIPTION OF THE DRAWING FIGURES

Other advantageous embodiment features become apparent from the following description and from the drawing, which illustrates a preferred embodiment of the invention with the aid of an example. In the drawing:
FIG. 1: shows an insulation-fault search system according to the state of the art; and
FIG. 2: shows the application of a test-current generator according to the invention for selectively shutting down a subsystem.

DETAILED DESCRIPTION

FIG. 1 shows the structure of an insulation-fault search system 2 in a 3-phase IT alternating-current system 4 (IT power supply system) comprising the outer conductors L1, L2 and L3 and two subsystems 8a, 8b, which branch off from a main system 6 and each have a connected equipment (load) V1, V2.

The subsystems are further characterized by leakage capacitances Ce1, Ce2 and insulation resistances Riso1, Riso2, the subsystem 8a exhibiting an insulation fault Rf in outer conductor L1.

An insulation monitoring device 7 is connected to outer conductor L1 and ground potential (ground) for continuous monitoring of the insulation resistance of the entire IT power supply system 4.

The insulation-fault search system 2 comprises a test-current generator 10 for generating a test current IL, two test-current sensors 12a, 12b for registering the test current IL in a potentially faulty subsystem 8a, 8b, and an insulation-fault evaluating device 14, which records the signals of the test-current sensors 12a, 12b and locates the insulation fault Rf.

In the illustrated application of the test-current generator 10 as according to the state of the art, the test current generated by the test-current generator 10 fulfils solely the function of a measuring current for determining the fault-current path and thus for locating the insulation fault Rf.

Figure 2:
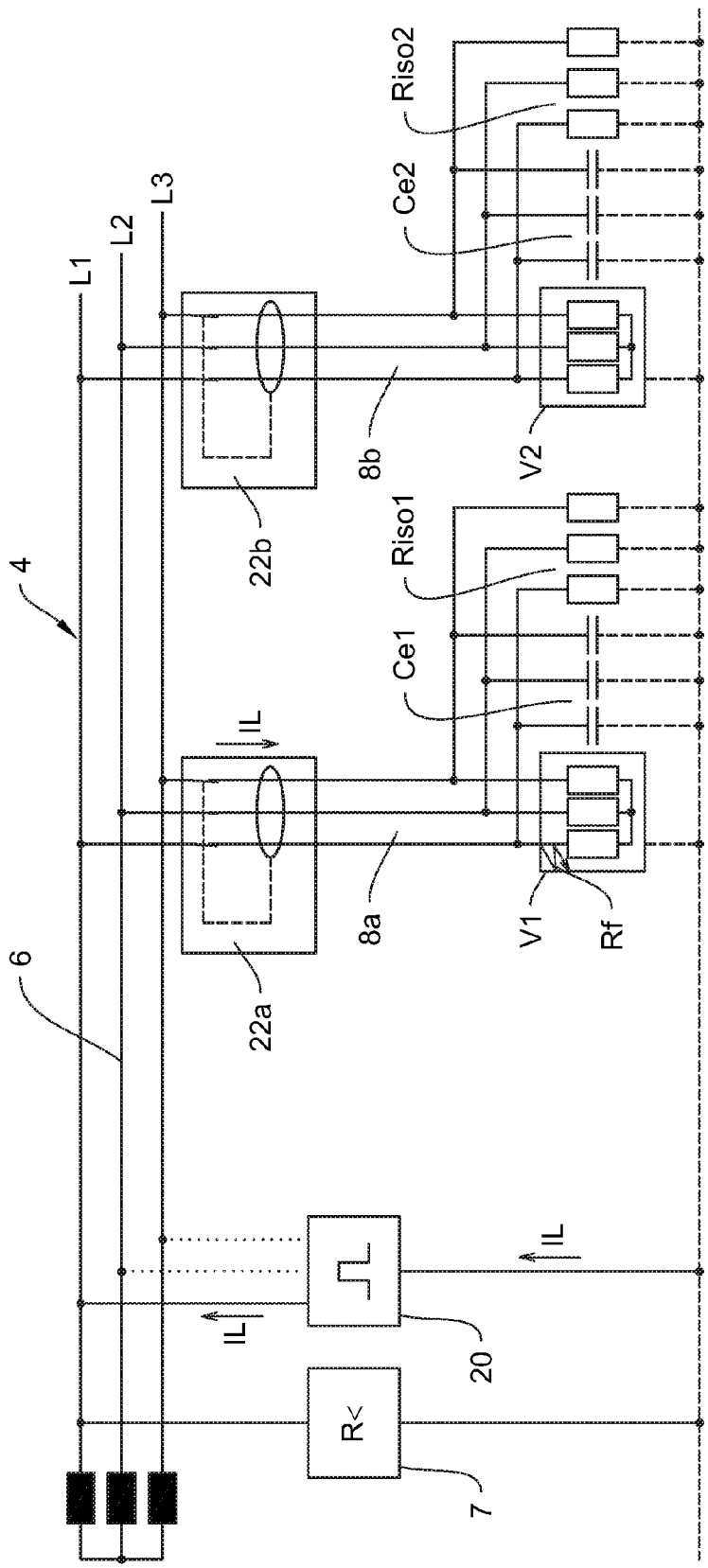

In FIG. 2, a test-current generator 20 according to the invention is illustrated in the application "subsystem shutdown". In this case, the faulty subsystem (here: subsystem 8a) is required to be quickly shut down because of the fault Rf occurring in said subsystem 8a without the shutdown affecting other subsystems (here: subsystem 8b) or even the entire IT power supply system 6.

As prescribed by standards, the subsystems 8a, 8b are equipped with residual current protection devices 22a, 22b. To trip the residual current protection device 22a arranged in the faulty subsystem 8a, the test-current generator 20 according to the invention feeds a test current IL functioning as a tripping current into the faulty outer conductor L1. The rate of increase of the fed tripping current is adjusted to the size of the network leakage capacitances. In the practical application, the test-current amplitude can be increased corresponding to the tripping characteristic of the residual current protection device to up to 150 mA, for example, the duration of test-current feeding at maximum test-current value being limited to 40 ms.

The invention claimed is:
1. A method for extended insulation-fault search in an IT power supply system (4), comprising the following method steps:
feeding a test current (IL) functioning as a locating current into at least one active conductor of the IT power supply system (4),
registering a test-current portion in a subsystem (8a, 8b) of the IT power supply system (4),
evaluating the registered test-current portion to locate an insulation fault (Rf),
characterized in that
selectively and depending on the application, the test current (IL), when functioning
as a voltage compensation current, compensates a voltage increase in an active conductor of the IT power supply system (4),
as a tripping current, trips a residual current protection device (22a, 22b) arranged in a subsystem (8a, 8b) of the IT power supply system (4),
as a leakage-capacitance compensation current, compensates a capacitive leakage current,
the test current (IL) being capable of fulfilling more than one of the cited functions simultaneously.
2. The method according to claim 1,
characterized in that
as a voltage compensation current, the test current (IL) effects a compensation of an excess voltage caused by a low-resistance insulation fault.
3. The method according to claim 1,
characterized in that
as a voltage compensation current, the test current (IL) effects a compensation of a displacement direct voltage.
4. The method according to claim 1,
characterized in that
when the test current (IL) functions as a voltage compensation current and as a leakage-capacitance compensation current, at least one of the test-current parameters test-current amplitude, test-current frequency and test-current phase is determined by control.
5. The method according to claim 1,
characterized in that
a maximum test-current value is predefined by a factory setting or directly by the user.
6. The method according to claim 5,
characterized in that
the maximum test-current value is derived from at least one electrical system parameter of the IT power supply system (4), the electrical system parameter being configured statically or determined dynamically.
7. The method according to claim 1,
characterized in that
the feeding of the test current (IL) as a voltage compensation current starts when a critical voltage-increase limit value is exceeded.
8. The method according to claim 1,
characterized in that
the feeding of the test current (IL) as a tripping current starts when the insulation resistance falls below an insulation-resistance limit value or when a critical voltage-increase limit value is exceeded.
9. The method according to claim 1,
characterized in that
a duration of the test-current feeding is limited.
10. The method according to claim 5,
characterized in that a duration of the test-current feeding at maximum test-current value is limited.

11. A test-current generator (20) for extended insulation-fault search in an IT power supply system, characterized by being configured as a multifunction test-current generator (20) comprising circuitry-related and programming-related devices that generate not only a test current (IL) for locating the insulation fault (Rf), but also, selectively and depending on the application, a voltage compensation current for compensating a voltage increase in an active conductor of the IT power supply system (4), a tripping current for tripping a residual current protection device (22*a*, 22*b*) arranged in a subsystem (8*a*, 8*b*) of the IT power supply system (4) and a leakage-capacitance compensation current for compensating a capacitive leakage current.

12. The test-current generator (20) according to claim 11, characterized in that the circuitry-related and programming-related devices comprise a control device for setting a test-current parameter.

13. The test-current generator (20) according to claim 11, characterized in that the circuitry-related and programming-related devices comprise a checking device for controlling the sequence of test-current generation and feeding.

14. An insulation-fault search system for extended insulation-fault search in an IT power supply system (4), comprising a test-current generator (20) for generating and feeding a test current (IL), a test-current registering device (12*a*, 12*b*) and an insulation-fault evaluating device (14), characterized in that the test-current generator (20) is configured as a multifunction test-current generator (20) according to claim 11.

* * * * *